(12) United States Patent
Kaneko et al.

(10) Patent No.: US 12,243,758 B2
(45) Date of Patent: Mar. 4, 2025

(54) MONITORING SYSTEM FOR A SEALING APPARATUS HAVING A SUBSTRATE TREATMENT APPARATUS IN A HOUSING UTILIZING A LASER SENSOR INSTALLED IN A SPACE BETWEEN THE HOUSING AND THE SUBSTRATE TREATMENT APPARATUS AND THAT SCANS A DETECTION REGION THEREIN

(71) Applicant: Tokyo Electron Limited, Tokyo (JP)

(72) Inventors: Shota Kaneko, Koshi (JP); Shigemi Oono, Koshi (JP); Norihide Sagara, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 1017 days.

(21) Appl. No.: 17/084,934

(22) Filed: Oct. 30, 2020

(65) Prior Publication Data

US 2021/0143033 A1    May 13, 2021

(30) Foreign Application Priority Data

Nov. 8, 2019  (JP) .................................. 2019-202929

(51) Int. Cl.
*G05B 19/406* (2006.01)
*H01L 21/67* (2006.01)
*H04N 7/18* (2006.01)

(52) U.S. Cl.
CPC ...... *H01L 21/67126* (2013.01); *G05B 19/406* (2013.01); *H04N 7/188* (2013.01); *G05B 2219/45031* (2013.01)

(58) Field of Classification Search
CPC ......... H01L 21/67126; H01L 21/67242; H01L 21/00; H01L 21/67259; H01L 21/67017; H01L 21/67225; G05B 19/406; G05B 2219/45031; G05B 19/048; G05B 2219/40607; G05B 2219/40613; G05B 19/41875; G05B 19/0428; H04N 7/188; H04N 7/18
See application file for complete search history.

(56) References Cited

U.S. PATENT DOCUMENTS 5,695,562 A  * 12/1997 Mizosaki .......... H01L 21/67778
                                                 118/712
8,688,275 B1 *  4/2014 LaFary ................. G05D 1/024
                                                   700/254

(Continued)

FOREIGN PATENT DOCUMENTS

| JP | 2002-064300 A | 2/2002 |
| JP | 2007-088485 A | 4/2007 |
| JP | 2019-140379 A | 8/2019 |

*Primary Examiner* — Robert E Fennema
*Assistant Examiner* — Marzia T Monty
(74) *Attorney, Agent, or Firm* — Posz Law Group, PLC

(57) ABSTRACT

A monitoring system is for a sealing apparatus that seals a substrate treatment apparatus by a housing and fills a space sealed by the housing with a predetermined gas atmosphere. The monitoring system includes: a laser sensor for a region, which a person can enter in a space between the housing and the substrate treatment apparatus, as a detection region; and a controller that outputs a control signal to the substrate treatment apparatus or the sealing apparatus based on a detection result by the laser sensor or outputs a notification signal based on the detection result.

6 Claims, 4 Drawing Sheets

(56) References Cited

U.S. PATENT DOCUMENTS

| | | | |
|---|---|---|---|
| 11,435,192 B1* | 9/2022 | Ebrahimi Afrouzi | G06T 7/55 |
| 2010/0245940 A1* | 9/2010 | Lai | H04N 1/0305 |
| | | | 358/474 |
| 2012/0092485 A1* | 4/2012 | Meinherz | G01S 7/4802 |
| | | | 348/91 |
| 2013/0213442 A1* | 8/2013 | Kaise | H01L 21/67393 |
| | | | 134/22.18 |
| 2018/0202805 A1* | 7/2018 | Unger | G01S 17/74 |
| 2018/0329039 A1* | 11/2018 | Katsumi | G01S 7/4813 |
| 2018/0361585 A1* | 12/2018 | Williams | A47L 11/14 |
| 2019/0130638 A1* | 5/2019 | Bridges | H04N 13/221 |
| 2019/0219991 A1* | 7/2019 | Main-Reade | G05B 19/41875 |

\* cited by examiner

MONITORING SYSTEM FOR A SEALING APPARATUS HAVING A SUBSTRATE TREATMENT APPARATUS IN A HOUSING UTILIZING A LASER SENSOR INSTALLED IN A SPACE BETWEEN THE HOUSING AND THE SUBSTRATE TREATMENT APPARATUS AND THAT SCANS A DETECTION REGION THEREIN

CROSS REFERENCE TO RELATED APPLICATIONS

This application is based upon and claims the benefit of priority of the prior Japanese Patent Application No. 2019-202929, filed in Japan on Nov. 8, 2019, the entire contents of which are incorporated herein by reference.

BACKGROUND OF THE INVENTION

1. Field of the Invention

This disclosure relates to a monitoring system.

2. Description of the Related Art

Japanese Laid-open Patent Publication No. 2007-88485 discloses a chamber apparatus housing, in a chamber room, a workpiece treatment apparatus requiring to perform a workpiece treatment in an atmosphere of an insert gas, the chamber apparatus including: the chamber room formed in an almost rectangle parallelepiped shape; a gas supply flow path configured to supply the inert gas into the chamber room; an air feed port continuing to the gas supply flow path and opening into the chamber room; an exhaust flow path configured to exhaust the inert gas in the chamber room; and an exhaust port continuing to the exhaust flow path and opening into the chamber room, in which the air feed port and the exhaust port are arranged at almost diagonal positions.

SUMMARY OF THE INVENTION

An aspect of this disclosure is a monitoring system for a sealing apparatus, the sealing apparatus configured to seal a substrate treatment apparatus by a housing and fill a space sealed by the housing with a predetermined gas atmosphere, the monitoring system including: a laser sensor for a region, which a person can enter in a space between the housing and the substrate treatment apparatus, as a detection region; and a controller configured to output a control signal to the substrate treatment apparatus or the sealing apparatus based on a detection result by the laser sensor or output a notification signal based on the detection result.

According to this disclosure, it is possible to improve the safety of a sealing apparatus configured to seal a substrate treatment apparatus by a housing and fill a space sealed by the housing with a predetermined gas atmosphere.

DETAILED DESCRIPTION OF THE INVENTION

Figure 1:
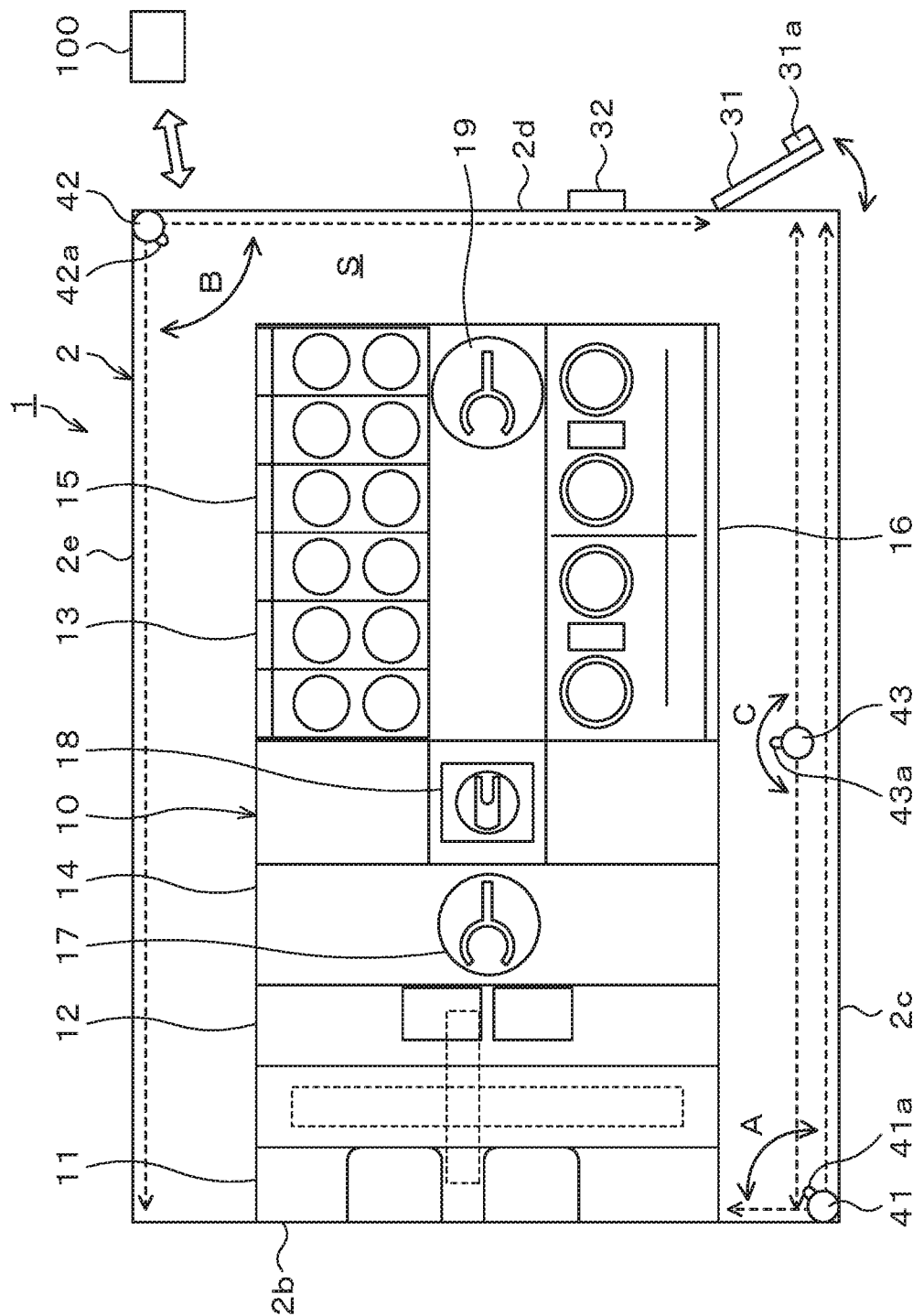
FIG. 1 is an explanatory view schematically illustrating a plane surface illustrating the outline of a configuration of a monitoring system according to an embodiment.

For example, in manufacture of a semiconductor device or a flat panel display, a substrate treatment apparatus which performs predetermined treatments on a substrate such as a semiconductor wafer or a glass substrate is used. In recent years, the predetermined treatments are performed in the substrate treatment apparatus while the substrate treatment apparatus itself is sealed by a housing and a space sealed by the housing is filled with a predetermined inert gas, for example, a nitrogen gas atmosphere as disclosed in Japanese Laid-open Patent Publication No. 2007-88485.

In this case, an operator who performs maintenance, repair and so on of the substrate treatment apparatus will enter the housing and perform the operation. As explained above, the inside of the housing is, for example, in the nitrogen gas atmosphere as explained above, and therefore needs to be brought into an oxygen concentration corresponding to that of air by releasing the nitrogen gas once prior to the operation. Then, after the finish of the operation, the operator exits the housing, and a nitrogen gas is supplied into the housing after confirmation of the exit of the operator.

However, if the nitrogen gas is supplied in a state where the operator remains in the housing, an unexpected accident may occur. Therefore, in the case where the substrate treatment apparatus is installed in the housing and the substrate treatment apparatus is operated in the atmosphere such as the inert gas in the housing, attention needs to be paid to safety so as to prevent the occurrence of such an accident.

The technique according to this disclosure improves the safety of a sealing apparatus configured to seal a substrate treatment apparatus by a housing and fill a space sealed by the housing with a predetermined gas atmosphere.

Hereinafter, a monitoring system according to an embodiment will be explained referring to the drawings. Note that the same codes are given to components having substantially the same functional configurations in the description to omit duplicated explanation.

Figure 2:
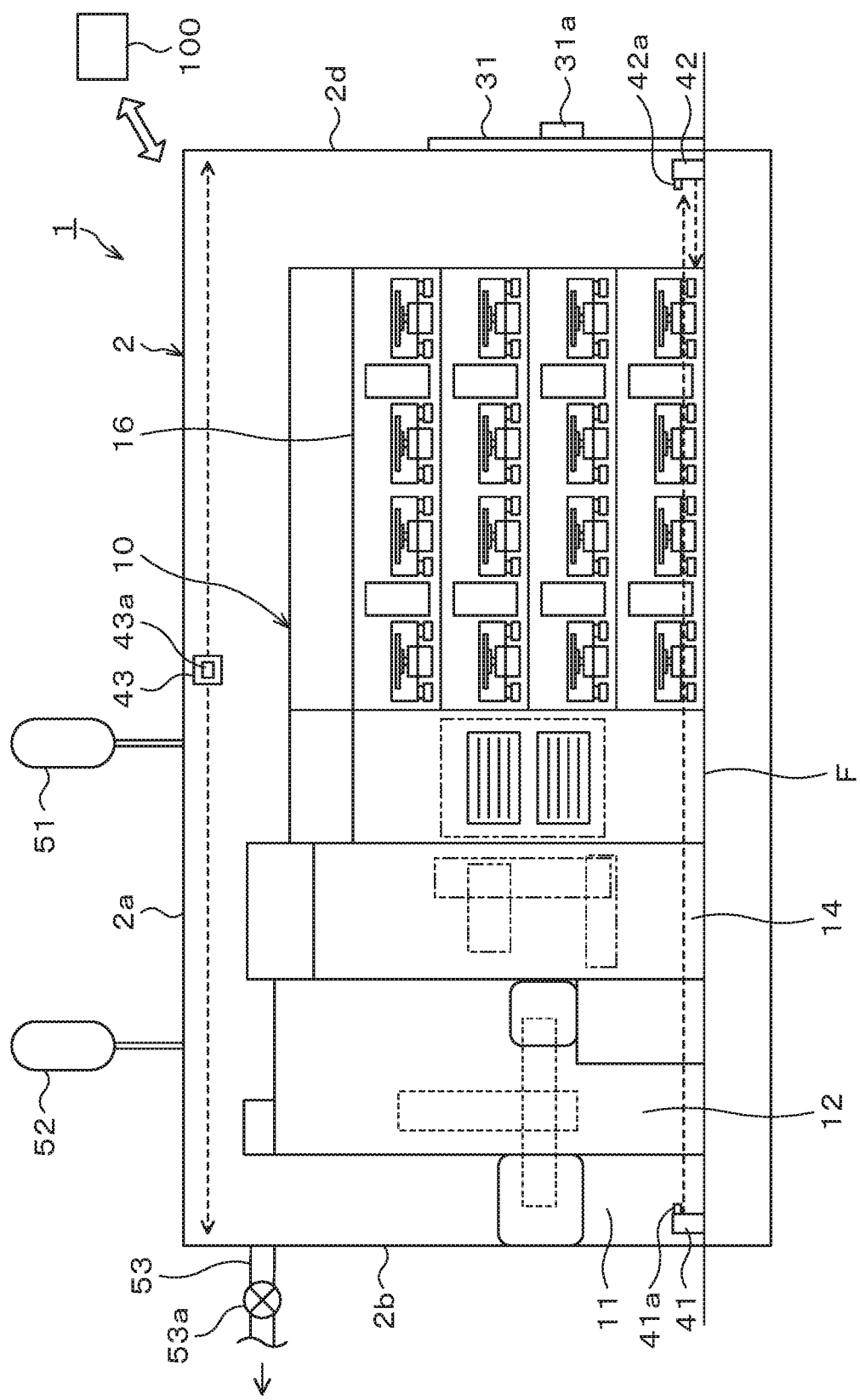
FIG. 2 is an explanatory view schematically illustrating a side surface illustrating the outline of the configuration of the monitoring system according to the embodiment.

FIG. 1 is a view schematically illustrating a plane surface of a monitoring system 1 according to this embodiment illustrating the outline of a configuration of the monitoring system 1, and FIG. 2 is a view schematically illustrating a side surface of the same monitoring system 1. A substrate treatment apparatus to which the monitoring system 1 is applied is a coating and developing treatment apparatus 10 used in a photolithograpy process.

The coating and developing treatment apparatus 10 has a cassette transfer in/out section 11 which transfers in/out a cassette housing a semiconductor wafer, a stock section 12 which stocks the cassette, and a relay section 14 which delivers the semiconductor wafer to/from a treatment section 13. In the treatment section 13, a thermal treatment section 15 which performs a predetermined thermal treatment on the semiconductor wafer and a solution treatment section 16 which performs a predetermined solution treatment are provided. Further, the coating and developing treatment apparatus 10 has transfer apparatuses 17, 18, 19 which perform the transfer of the semiconductor wafer.

The coating and developing treatment apparatus 10 having the above configuration is sealed at an upper surface and four side surfaces by a housing 2 constituting a sealing apparatus. In other words, the housing 2 is composed of, for example, panel materials, and has an upper surface part 2a which covers an upper surface of the coating and developing treatment apparatus 10, and a front surface part 2b, a side surface part 2c, a back surface part 2d, and a side surface part 2e which surround four side surfaces of the coating and developing treatment apparatus 10.

Further, for example, the back surface part 2d of the housing 2 is provided with an openable/closable door 31 for an operator to enter and exit the housing 2. The door 31 is provided with a locking mechanism 31a. Therefore, when entering the housing 2, the operator needs to unlock the locking mechanism 31a and open the door 31. The locking mechanism 31a is, for example, an electromagnetic lock and is configured such that the electromagnetic lock cannot be locked during the time when one of later-explained laser sensors 41, 42, 43 detects an object.

Further, a space S in an almost U-shape in plan view which the operator can enter is formed between the coating and developing treatment apparatus 10 and the housing 2 as illustrated in FIG. 1 and FIG. 2. The laser sensors 41, 42 are installed at two opposing corner portions in the space S, namely, at corner portions located on a diagonal line in plan view of the housing 2.

The laser sensors 41, 42 have the same configuration, and employ a so-called laser beam scanner configuration which applies a laser beam of infrared light while radially scanning it by reciprocally turning in a predetermined angle range in this embodiment. In this example, the laser sensors 41, 42 are set to have a turn angle of 90 degrees, and the laser sensor 41 is configured to apply the laser beam at a turn angle A illustrated by a reciprocating turn arrow in the drawing so as to have a region between the front surface part 2b and the side surface part 2c of the housing 2 as a detection range as illustrated in FIG. 1. The laser sensor 42 is configured to apply the laser beam at a turn angle B illustrated by a reciprocating turn arrow in the drawing so as to have a region between the back surface part 2d and the side surface part 2e of the housing 2 as a detection range. If an object exists within the detection range, the laser sensor 41, 42 detects the object and outputs a detection signal to a controller 100. The installation height of the laser sensor 41, 42 is, for example, 100 to 300 mm, for example, 200 mm from a floor surface F. This makes it possible to detect, for example, a fallen person.

On the other hand, near the upper surface part 2a of the housing 2, namely, a position higher than a ceiling portion of the coating and developing treatment apparatus 10, the laser sensor 43 is provided at a middle portion of the side surface part 2c in plan view. The basic configuration of the laser sensor 43 is the same as those of the laser sensors 41, 42, but its reciprocating turn angle is set to 180 degrees. In other words, a turn angle C of the laser beam from the laser sensor 43 is set to 180 degrees as illustrated in FIG. 1.

The laser sensors 41, 42, 43 are provided with imaging devices 41a, 42a, 43a. For example, the imaging devices 41a, 42a have cameras having an angle of view of 90 degrees or larger and the imaging device 43a has a camera having an angle of view of 180 degrees or larger, the cameras imaging the detection ranges of the laser sensors 41, 42, 43 at all times. As a matter of course, the imaging device 41a, 42a, 43a may be configured to image a detected position when the laser sensor 41, 42, 43 detects the object. In this case, the angles of view of the cameras may be smaller than 90 degrees or 180 degrees.

Then, image data obtained by imaging is stored, in association with the position where and the time when any of the laser sensors 41, 42, 43 has detected the object, in an appropriate storage, for example, a storage area of a server or the controller 100. In addition to the above, when any of the laser sensors 41, 42, 43 has detected the object, the position where the object has been detected, the identification of the laser sensor having detected the object, and the captured image are displayed on a display 32 provided near the door 31 outside the housing 2.

Furthermore, when any of the laser sensors 41, 42, 43 has detected the object, the controller 100 outputs an alarm or a caution signal notifying an external part of the detection, and displays it also on the display 32.

The monitoring system 1 further has a gas supplier 51 which supplies a predetermined gas, for example, an inert gas such as a nitrogen gas into the housing 2. The supply and stop of the inert gas by the gas supplier 51 is controlled by the controller 100. For example, when any of the laser sensors 41, 42, 43 detects the object, a control signal not to supply the inert gas by the gas supplier 51 is outputted to the gas supplier 51.

The housing 2 is provided with an air supplier 52. The supply of air by the air supplier 52 is controlled by the controller 100. The exhaust of an atmosphere in the housing 2 is performed through an exhauster 53 provided at the housing 2. The exhauster 53 is provided with a valve 53a, and the opening and closing of the valve 53a are controlled by the controller 100.

Figure 3:
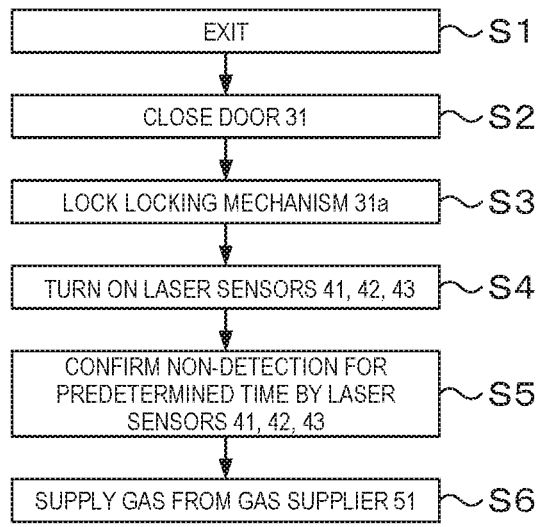
FIG. 3 is a flowchart at the time of exit in the monitoring system according to the embodiment.

The monitoring system 1 according to the embodiment is configured as above, and its operation will be explained next. The technique according to this disclosure improves the safety by preventing such a situation that the housing 2 is sealed and gas is supplied into the housing 2 in a state where the operator remains in the housing 2 at the time of exit of the operator. Accordingly, the flow at the time of exit will be explained first based on FIG. 3.

First, when the operator exits the housing 2 (Step S1), the door 31 is closed (Step S2). Then, the locking mechanism 31a is locked (Step S3). Then, the laser sensors 41, 42, 43 are turned ON (Step S4). This starts a detection sequence by the laser sensors 41, 42, 43. Then, it is confirmed that any of the laser sensors 41, 42, 43 detects nothing for a predetermined time, for example, 20 to 30 seconds (Step S5). Then, after it is confirmed that any of the laser sensors 41, 42, 43 detects nothing, the supply of gas from the gas supplier 51 is started (Step S6). The supply of gas from the gas supplier 51 is enabled only after the controller 100 recognizes that all of the above steps have been completed.

If any of the laser sensors 41, 42, 43 detects an object in the housing 2 in the middle of each step, the operation cannot proceed to the next step. For example, when any of the laser sensors 41, 42, 43 detects an object after the door 31 is closed at Step S2, the locking mechanism 31a cannot be locked. This control is performed also by the controller 100.

If any of the laser sensors 41, 42, 43 detects an object in the housing 2 after the laser sensors 41, 42, 43 are turned ON, the supply of gas from the gas supplier 51 cannot be started. Accordingly, safety for the operator existing in the housing 2 is improved.

If any of the laser sensors 41, 42, 43 detects an object in the housing 2, an alarm is issued, so that the operator himself/herself existing in the housing 2 or other operators can know the detection of the object. When any of the laser sensors 41, 42, 43 detects an object in the housing 2, the region where the detected object exists is imaged, thus making it possible to easily confirm whether the detected object is an operator or a work tool left behind. In addition, the image captured in conjunction with the detected fact is stored in the server or the controller 100, and therefore can be confirmed sequentially or afterward.

Besides, the controller 100 may be configured to interlock the coating and developing treatment apparatus 10 if any of the laser sensors 41, 42, 43 detects an object in the middle of each step. This can further secure safety for the operator.

Figure 4:
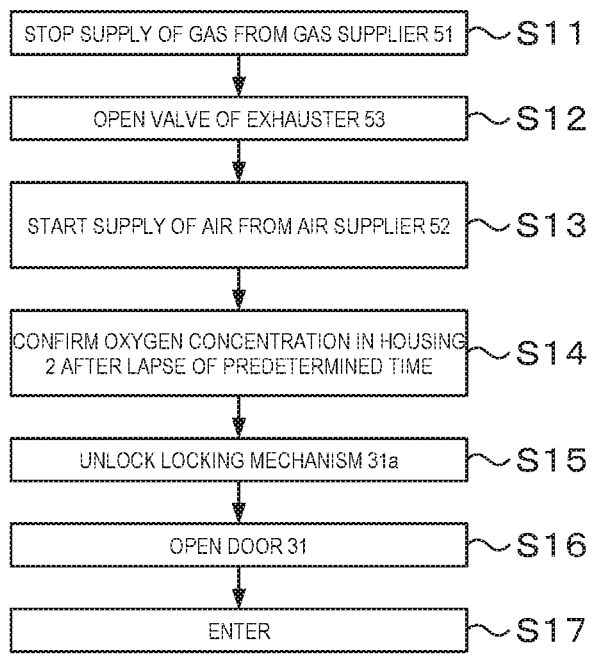
FIG. 4 is a flowchart at the time of entry in the monitoring system according to the embodiment.

Next, the flow at the time of entry will be explained based on FIG. 4. First, the supply of gas from the gas supplier 51 is stopped (Step S11). Then, the valve 53*a* of the exhauster 53 is opened (Step S12). Further, the supply of air from the air supplier 52 into the housing 2 is started (Step S13). Step S12 and Step S13 may be performed simultaneously. This replaces the atmosphere inside the housing 2 with air.

Then, after the confirmation of the lapse of a predetermined time, which differs depending on the capacity of the housing 2, for example, about one hour, the oxygen concentration in the housing 2 is confirmed (Step S14). The reference of the oxygen concentration is set to, for example, 19.5% or more, and when the reference is not exceeded, the air replacement operation is continued until the reference is satisfied. Then, after the reference of the oxygen concentration is satisfied, the lock state of the locking mechanism 31*a* of the door 31 is released (Step S15). In this case, it is desirable that the controller 100 is configured to control the locking mechanism 31*a* so that when the reference is not satisfied, the operator cannot release the lock of the locking mechanism 31*a* even if the operator tries to release the lock.

Then, after the lock state of the locking mechanism 31*a* of the door 31 is released, the operator opens the door 31 (Step S16), and then will enter the housing 2 (Step S17). Note that the control may be made such that when the door 31 is already opened, interlock is made so as to prevent, for example, the gas from the gas supplier 51 from being supplied into the housing 2.

The above-explained monitoring system 1 is an example in the case where the coating and developing treatment apparatus 10 being the substrate treatment apparatus as the monitoring target has only the floor surface and therefore the region which the operator enters exists only on the floor surface in the housing 2. However, this disclosure is not limited to the above substrate treatment apparatus but is applicable to an apparatus in which a region which the operator enters exists also at a portion above the floor surface as illustrated in FIG. 5.

Figure 5:
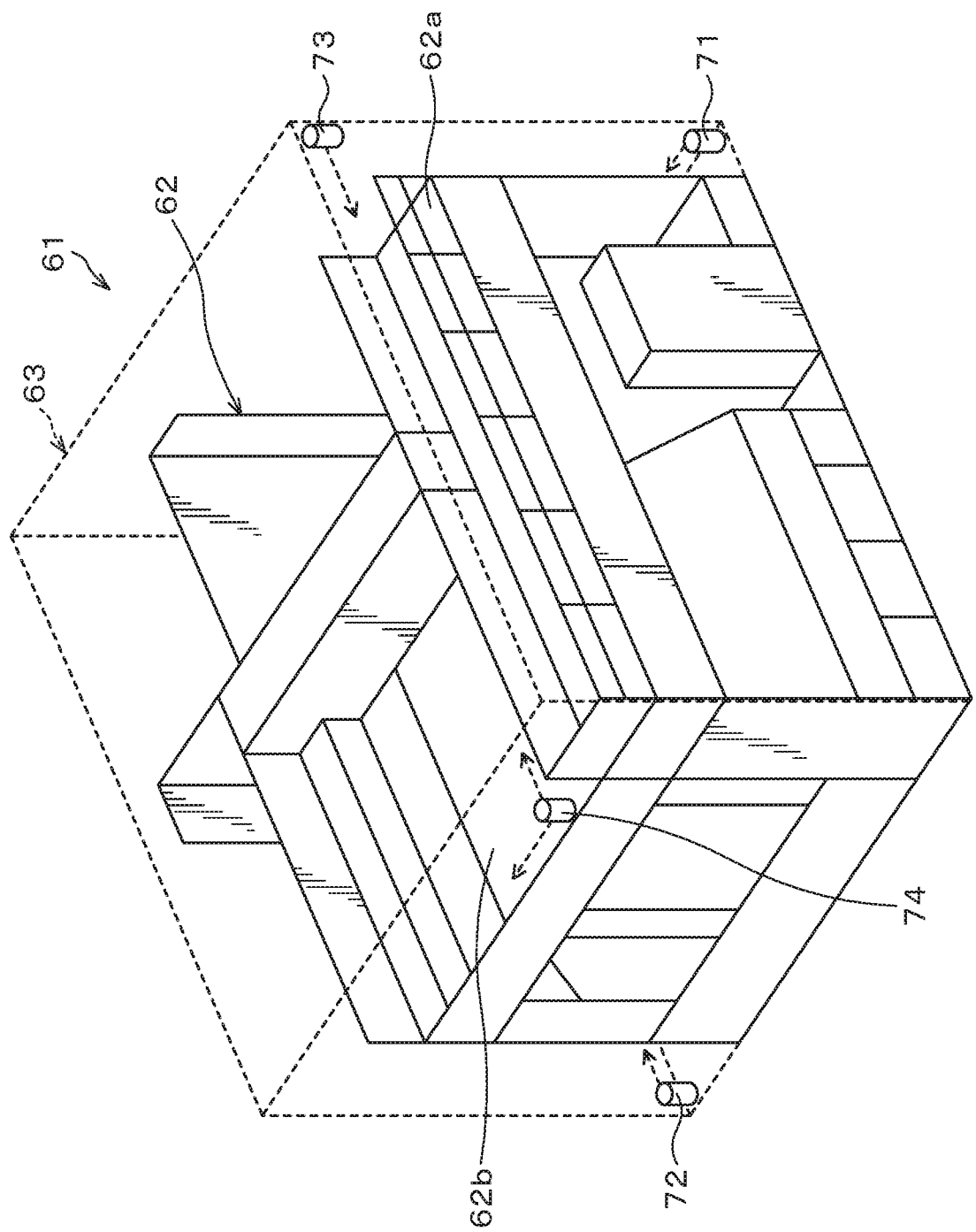
FIG. 5 is a perspective view illustrating the outline of a configuration of a monitoring system applied to another substrate treatment apparatus.

More specifically, a monitoring system 61 illustrated in FIG. 5 indicates an appearance in which it is applied to a housing 63 sealing a substrate treatment apparatus 62 which has a region 62*a* where the operator enters a part above the floor surface and performs an operation and a region 62*b* having a step. More specifically, laser sensors 73, 74 for the regions 62*a*, 62*b* as detection regions are installed in addition to laser sensors 71, 72 installed near the floor surface. This can eliminate blind spots in the high substrate treatment apparatus 62 as illustrated in FIG. 5, for example, an ink-jet apparatus to prevent a predetermined gas from being supplied into the housing 63 with the operator remaining in the housing 63.

As a matter of course, not only in the region located at the high position, but also in a region which a person enters, if the region exists, for example, at a portion located below the bottom surface of the installed substrate treatment apparatus, the above-explained laser sensor may be installed also in the region.

The embodiment disclosed this time is only an example in all respects and should not be considered to be restrictive. The above embodiment may be abbreviated, replaced, or changed in various forms without departing from the scope and spirit of the attached claims.

Note that the following configurations also belong to the technical scope of this disclosure.

(1) A monitoring system for a sealing apparatus, the sealing apparatus configured to seal a substrate treatment apparatus by a housing and fill a space sealed by the housing with a predetermined gas atmosphere, the monitoring system including: a laser sensor for a region, which a person can enter in a space between the housing and the substrate treatment apparatus, as a detection region; and a controller configured to output a control signal to the substrate treatment apparatus or the sealing apparatus based on a detection result by the laser sensor or output a notification signal based on the detection result.

The substrate treatment apparatus mentioned here is a manufacturing apparatus for, for example, a semiconductor device or a flat panel display.

Besides, an example of the control signal to be outputted to the substrate treatment apparatus can be, for example, a signal to make an interlock.

Examples of the control signal to be outputted to the sealing apparatus include signals to disable the completion of the sealing, disable the locking of the door, disable the supply of the predetermined gas and so on.

Examples of the notification signal based on the detection result include an appropriate caution signal, issuing of an alarm, lighting of a warning light and so on.

(2) The monitoring system according to (1), wherein: the sealing apparatus includes a supplier configured to supply a predetermined gas for filling the sealed space with the predetermined gas atmosphere; and the controller outputs a control signal not to supply the predetermined gas by the supplier, to the sealing apparatus when the laser sensor detects an object.

(3) The monitoring system according to (1) or (2), further including an imaging device configured to image the region which the person can enter, wherein when the laser sensor has detected an object, the imaging device images at least a region where the object has been detected.

(4) The monitoring system according to (3), wherein the detection result by the laser sensor is associated with the captured image.

(5) The monitoring system according to any one of (1) to (4), wherein: the sealing apparatus has an openable/closable door for entrance to and exit from the sealed space, and a locking mechanism of the door; and the controller outputs a signal to switch an operation of the locking mechanism of the door based on the detection result by the laser sensor.

An example of the operation of the locking mechanism of the door can be an operation of preventing a person from locking the door even if the person tries to lock the door.

(6) The monitoring system according to any one of (1) to (5), wherein the control signal outputted to the substrate treatment apparatus based on the detection result by the laser sensor is a signal to interlock the substrate treatment apparatus.

What is claimed is:

1. A monitoring system for a sealing apparatus, the sealing apparatus configured to seal a substrate treatment apparatus by a housing and fill a space sealed by the housing with a predetermined gas atmosphere, the monitoring system comprising:
   at least two laser sensors for a region which a person can enter in a space between the housing and the substrate treatment apparatus, as a detection region; and
   a controller configured to output a control signal to the substrate treatment apparatus or the sealing apparatus based on a detection result by at least one of the two laser sensors or output a notification signal based on the detection result, wherein
   the housing has an upper surface and four side surfaces,
   a U-shaped space in plan view is formed between the housing and the substrate apparatus,
   the two laser sensors are installed, in the U-shaped space, respectively at each of two opposing corner portions located on a diagonal line in plan view of the housing so as to eliminate a blind spot in the U-shaped space, and an installation height of the two laser sensors is 100 to 300 mm from a floor surface in the U-shaped space, and
   each of the two laser sensors scans a laser beam by reciprocally turning in a predetermined angle range and scans a region from a side surface of the four side surfaces of the housing to the substrate treatment apparatus in the U-shaped space.

2. The monitoring system according to claim 1, wherein:
   the sealing apparatus includes a supplier configured to supply a predetermined gas for filling the sealed space with the predetermined gas atmosphere; and
   the controller outputs a control signal not to supply the predetermined gas by the supplier, to the sealing apparatus when the at least one of the two laser sensors detects an object.

3. The monitoring system according to claim 1, further comprising
   a camera configured to image the region which the person can enter, wherein
   when the at least one of the two laser sensors has detected an object, the camera images at least a region where the object has been detected.

4. The monitoring system according to claim 3, wherein the detection result by the at least one of the two laser sensors is associated with the captured image.

5. The monitoring system according to claim 1, wherein:
   the sealing apparatus has an openable/closable door for entrance to and exit from the sealed space, and a locking mechanism of the door; and
   the controller outputs a signal to switch an operation of the locking mechanism of the door based on the detection result by the at least one of the two laser sensors.

6. The monitoring system according to claim 1, wherein the control signal outputted to the substrate treatment apparatus based on the detection result by the at least one of the two laser sensors is a signal to interlock the substrate treatment apparatus.

* * * * *